United States Patent
Shin

(10) Patent No.: US 10,354,723 B2
(45) Date of Patent: Jul. 16, 2019

(54) MEMORY DEVICE AND METHOD FOR PROGRAMMING THE SAME

(71) Applicant: SK hynix Inc., Gyeonggi-do (KR)

(72) Inventor: Kye-Wan Shin, Pleasanton, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/992,940

(22) Filed: May 30, 2018

(65) Prior Publication Data

US 2019/0006004 A1    Jan. 3, 2019

Related U.S. Application Data

(60) Provisional application No. 62/526,648, filed on Jun. 29, 2017.

(51) Int. Cl.
*G11C 11/56* (2006.01)
*G11C 16/04* (2006.01)

(52) U.S. Cl.
CPC ...... *G11C 11/5628* (2013.01); *G11C 11/5671* (2013.01); *G11C 16/0475* (2013.01); *G11C 16/0483* (2013.01); *G11C 2211/5621* (2013.01)

(58) Field of Classification Search
CPC ............ G11C 11/5628; G11C 11/5671; G11C 11/5621; G11C 16/0483; G11C 16/0458; G11C 16/0475; G11C 2211/5621
USPC ............................ 365/185.03, 185.11, 185.28
See application file for complete search history.

(56) References Cited

U.S. PATENT DOCUMENTS

| | | | |
|---|---|---|---|
| 6,757,193 B2 | 6/2004 | Chen et al. | |
| 7,301,817 B2 * | 11/2007 | Li | G11C 11/5628 365/185.03 |
| 7,489,547 B2 * | 2/2009 | Moogat | G11C 11/5628 365/185.03 |
| 8,180,994 B2 * | 5/2012 | Sprouse | G11C 11/5628 365/230.01 |
| 8,391,062 B2 | 3/2013 | Jang | |
| 2006/0209592 A1 * | 9/2006 | Li | G11C 11/5642 365/185.03 |
| 2015/0078079 A1 * | 3/2015 | D'Abreu | G11C 16/10 365/185.03 |

* cited by examiner

*Primary Examiner* — Tan T. Nguyen
(74) *Attorney, Agent, or Firm* — IP & T Group LLP

(57) ABSTRACT

A memory device may include: a memory cell array including a plurality of memory cells; and a control circuit suitable for programming the memory cell array. The control circuit may program the memory cell array according to a predetermined coding method, such that read voltage levels for multi-sensing are minimized and the numbers of read operations for logical pages are distributed. Therefore, the memory device can improve the cell distribution for the plurality of memory cells and the performance of read timing.

13 Claims, 13 Drawing Sheets

FIG. 11

| E-cells | | R1 | R2 | R3 | R4 | R5 | R6 | R7 | | |
|---|---|---|---|---|---|---|---|---|---|---|
| | MSB | | 4KB | | | | 8KB | | | Read 2-time | Read 3-time |
| | CSB | 2KB | | 4KB | | 4KB | | 4KB | Read 4-time | Read 4-time |
| | LSB | | | | 8KB | | | | Read 1-time | Read 2-time |
| Single Sensing | | R1 | R2 | R3 | R4 | R5 | R6 | R7 | 5 | 5 |
| Multi Sensing | | | | | | | | | 2 | 4 |
| | | | | | | | | | | 9 |

Read Point

| | | R1 | R2 | R3 | R4 | R5 | R6 | R7 | R8 | R9 | R10 | R11 | R12 | R13 | R14 | R15 | | |
|---|---|---|---|---|---|---|---|---|---|---|---|---|---|---|---|---|---|---|
| E-cells | QSB | | | | 4KB | | | | | | | | | | | | | Read 2-time | Read 3-time |
| | MSB | | 2KB | 3KB | | | | 4KB | | | | 4KB | 8KB | | | | | Read 4-time | Read 4-time |
| | CSB | 2KB | | | | 4KB | 4KB | | 2KB | | 2KB | | | | 4KB | 4KB | | Read 5-time | Read 5-time |
| | LSB | 1KB | | | | 4KB | | | | 4KB | | | | 4KB | | | | Read 4-time | Read 4-time |
| Single Sensing | | R1 | R2 | R3 | R4 | R5 | R6 | R7 | R8 | R9 | R10 | R11 | R12 | R13 | R14 | R15 | | 14 | 14 |
| Multi Sensing | | | | | | | | | | | | | R12 | | | | | 1 | 2 |
| | | | | | | | | | | | | | | | | | | | 16 |

Read Point

MEMORY DEVICE AND METHOD FOR PROGRAMMING THE SAME

CROSS-REFERENCE TO RELATED APPLICATION

This application claims priority to U.S. Provisional Patent Application No. 62/526,648 entitled, "QLC LOGIC CODE FOR CELL DISTRIBUTION/tR IMPROVEMENT," filed on Jun. 29, 2017, which is incorporated herein by reference in its entirety.

BACKGROUND

1. Field

Various embodiments of the present invention relate to a program operation of a memory device.

2. Discussion of the Related Art

Electronic devices such as computers, mobile phones, and storage devices may include integrated circuits (ICs) having various elements or circuits integrated therein. Each of the integrated circuits may be coupled to one or more external circuits or devices, and include components for interfacing with external circuits or devices. For example, a peripheral memory device may be coupled to a memory controller, thereby constituting a memory system.

In general, various signals such as data, addresses, and commands may be transmitted and/or received between the memory device and the memory controller in the memory system. Therefore, multiple operations, such as program, read, and erase operations may be performed on the memory device by the memory controller.

SUMMARY

Various embodiments are directed to a memory device and a method for programming the same.

Also, various embodiments are directed to a coding method capable of programming a plurality of memory cells, in order to minimize read voltage levels for multi-sensing operations in a memory device while distributing the multiple read operations for logical pages respectively.

In an embodiment, a method for programming a memory device including a plurality of memory cells may include: constituting a matrix which has rows for at least an upper page, a central page, and a lower page and columns for a plurality of voltage levels; dividing elements of the matrix into first to third groups in combinations of the row of the upper page and the columns, and into fourth to sixth groups in combinations of the rows of the central and lower pages and the columns; allocating a first bit value to an initial sequence constituted by a combination of the rows and a first column of the columns, allocating the first bit value to the elements of the first group and the elements of the third group, and allocating a second bit value to the elements of the second group; allocating the second bit value to at least one element, among elements in the fourth group, in the row of at least one of the central page and the lower page, the at least one element to which the second bit value is allocated being positioned in a left diagonal direction from a first element of the second group; allocating the first or second bit value to elements of the fourth group to which no bits values are yet allocated based on the bit values allocated to the initial sequence and the at least one element, such that the initial sequence and at least one other sequence constituted by one or more combinations of the rows and one or more initial columns following the first column constitute a gray code; allocating the first or second bit value to elements of the fifth group based on the bit values allocated to the at least one other sequence and the elements of the second group, such that a plurality of sequences constituted by combinations of the rows and central columns following the one or more initial columns constitute a gray code with the at least one other sequence; and allocating the first or second bit value to the elements of the sixth group based on the bit values allocated to the plurality of sequences and the elements of the third group, such that further sequences constituted by combinations of the rows and columns following the central columns constitute a gray code with the plurality of sequences.

In an embodiment, a memory device may include: a memory cell array including a plurality of memory cells; and a control circuit suitable for programming the memory cell array. The control circuit may program the memory cell array by performing operations of: constituting a matrix which has rows for at least an upper page, a central page, and a lower page and columns for a plurality of voltage levels; dividing elements of the matrix into first to third groups in combinations of the row of the upper page and the columns, and into fourth to sixth groups in combinations of the rows of the central and lower pages and the columns; allocating a first bit value to an initial sequence constituted by a combination of the rows and a first column of the columns, allocating the first bit value to the elements of the first group and the elements of the third group, and allocating a second bit value to the elements of the second group; allocating the second bit value to at least one element, among elements in the fourth group, in the row of at least one of the central page and the lower page, the at least one element to which the second bit value is allocated being positioned in a left diagonal direction from a first element of the second group; allocating the first or second bit value to elements of the fourth group to which no bits values are yet allocated based the bit values allocated to the initial sequence and the at least one element, such that the initial sequence and at least one other sequence constituted by one or more combinations of the rows and one or more initial columns following the first column constitute a gray code; allocating the first or second bit value to the elements of the fifth group based on the bit values allocated to the at least one other sequence and the elements of the second group, such that a plurality of sequences constituted by combinations of the rows and central columns following the one or more initial columns constitute a gray code with the at least one other sequence; and allocating the first or second bit value to the elements of the sixth group based on the bit values allocated to the plurality of sequences and the elements of the third group, such that further sequences constituted by combinations of the rows and the other columns following the central columns constitute a gray code with the plurality of sequences.

BRIEF DESCRIPTION OF THE DRAWINGS

The description below makes reference to the accompanying drawings wherein like reference numerals refer to like parts throughout the several views, and wherein:

FIG. 11 illustrates an operation of reading a plurality of memory cells in accordance with an embodiment.

FIG. 12 illustrates an operation of programming a plurality of memory cells in accordance with an embodiment.

FIG. 13 illustrates an operation of reading a plurality of memory cells in accordance with an embodiment.

DETAILED DESCRIPTION

Figure 1A:
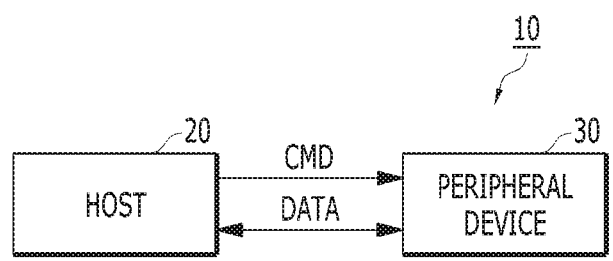
FIGS. 1A and 1B illustrate a data processing system in accordance with an embodiment.

Various embodiments will be described below in more detail with reference to the accompanying drawings. Aspects and features of present invention may, however, be configured or arranged differently than shown in the drawings. Thus, the present invention is not limited to the embodiments set forth herein. Rather, these embodiments are provided so that this disclosure is thorough and complete and will fully conveys the scope of the disclosure to those skilled in the art. Throughout the disclosure, like reference numerals refer to like parts throughout the various figures and embodiments of the present invention. It is noted that reference to "an embodiment" is not necessarily to only one embodiment, and different references to "an embodiment" are not necessarily to the same embodiment(s).

Moreover, the terminology used herein is for describing examples and is not intended to limit the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features but do not preclude the presence or addition of one or more other non-stated features.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

The terminology used herein is for the purpose of describing particular embodiments only and is not intended to be limiting of the present invention.

Hereinafter, the various embodiments of the present invention will be described in detail with reference to the attached drawings.

Figure 1B:
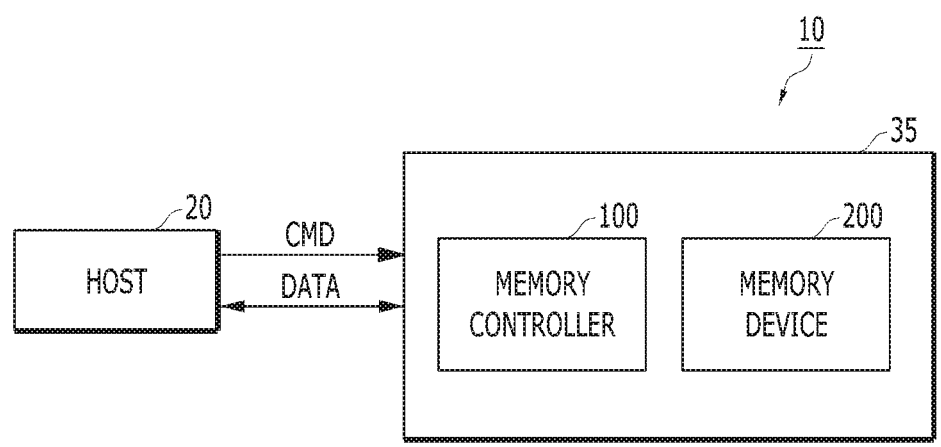

FIGS. 1A and 1B illustrate a data processing system in accordance with an embodiment of the present invention.

Referring to FIG. 1A, a data processing system 10 may include a host 20 and a peripheral device 30. The peripheral device 30 may receive a command CMD (or request) from a host 20, and exchange data DATA with the host 20 according to the received command. By way of example but not limitation, the host 20 may include a computer, a server, a smart phone and the like, and the peripheral device 30 may include a mobile or storage product.

Referring to FIG. 1B, the peripheral device 30 illustrated in FIG. 1A may be implemented by a memory system 35. That is, a data processing system 10 may include the host 20 and the memory system 35. The host 20 may include, for example, portable electronic devices such as a mobile phone, MP3 player, and laptop computer or electronic devices such as a desktop computer, game machine, TV, and projector.

Data stored in the memory system 35 may be accessed in response to a command delivered from the host 20. The memory system 35 may be used as a main memory device or auxiliary memory device of the host 20.

The memory system 35 may include a memory controller 100 and a memory device 200. The memory controller 100 may perform an access operation on the memory device 200 in response to the command from the host 20. By way of example but not limitation, the memory controller 100 may store write data from the host 20 in the memory device 200 in response to a write command from the host 20. For another example, the memory controller 100 may read data stored in the memory device 200 in response to a read command from the host 20, and may transfer the read data to the host 20. In various embodiments, the memory device 200 may include volatile memory devices such as a dynamic random access memory (DRAM) and static RAM (SRAM). In other embodiments, the memory device 200 may include any of various types of nonvolatile memory devices such as a read only memory (ROM), a mask ROM (MROM), a programmable ROM (PROM), erasable ROM (EPROM), an electrically erasable ROM (EEPROM), ferromagnetic ROM (FRAM), a phase change RAM (PRAM), a magnetic RAM (MRAM), a resistive RAM (RRAM) and a flash memory.

Figure 2:
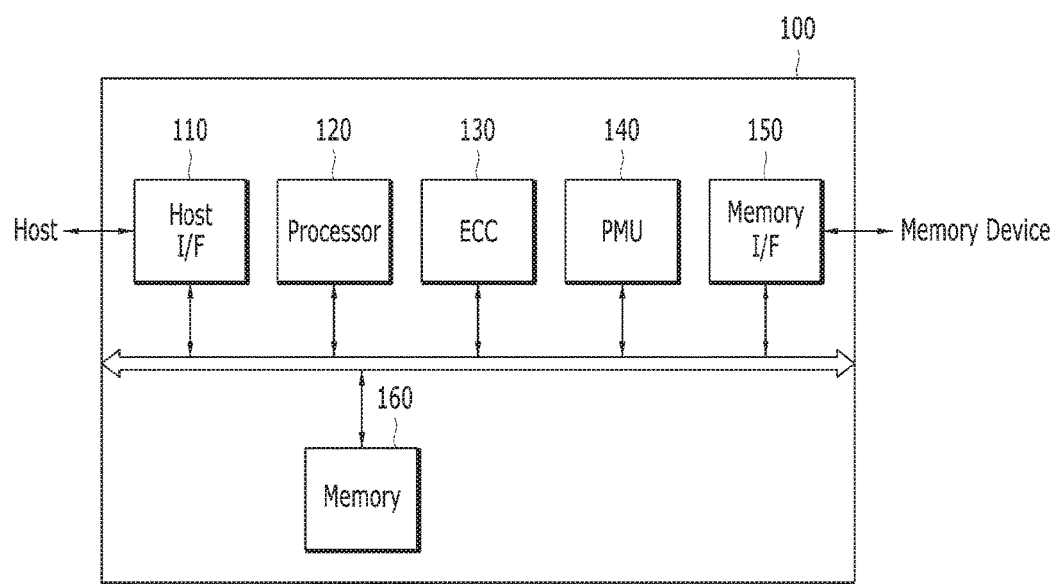
FIG. 2 illustrates a memory controller in accordance with an embodiment.

FIG. 2 illustrates an example of the memory controller in accordance with an embodiment. By way of example but not limitation, FIG. 2 illustrates the configuration of the memory controller 100 illustrated in FIG. 1B.

Referring to FIG. 2, the memory controller 100 may include a host interface (I/F) circuit 110, a processor 120, an error correction code (ECC) circuit 130, a power management unit (PMU) 140, a memory interface (I/F) circuit 150, and a memory 160.

The host I/F circuit 110 may process a command and data which are received from the host 20. The host I/F circuit 110 may enable the memory controller 100 to communicate with the host 20 through one or more of various interface protocols.

The ECC circuit 130 may detect and correct an error contained in data read from a memory device, for example, the memory device 200 illustrated in FIG. 1B.

The PMU 140 may provide electrical power to components included in the memory controller 100, and manage the electrical power provided to the components.

The memory I/F circuit 150 may perform interfacing between the memory controller 100 and the memory device 200. Specifically, the memory I/F circuit 150 may process a command and data exchanged between the memory controller 100 and the memory device 200 according to control of the processor 120. By way of example but not limitation, the memory I/F circuit 150 may transfer write data from the host 20 to the memory device 200 in response to a write command from the host 20, such that the write data are stored in the memory device 200. For another example, the memory I/F circuit 150 may receive data outputted from the memory device 200 in response to a read command from the host 20, and may transfer the read data to the host 20.

The memory 160 may serve as a working memory of the memory system 35 and the memory controller 100, and store data related to the operations of the memory system 35 and the memory controller 100. By way of example but not limitation, the memory 160 may store program data required for performing a write operation and/or a read operation between the host 20 and the memory device 200 by the host 20, and may store write data and/or read stored data. The memory 160 may be implemented with a volatile memory such as SRAM or DRAM.

The processor 120 may control overall operations of the memory system 35. By way of example but not limitation, the processor 120 may control a write operation and/or read operation on the memory device 200 in response to a write request or a read request delivered from the host 20.

Figure 3:
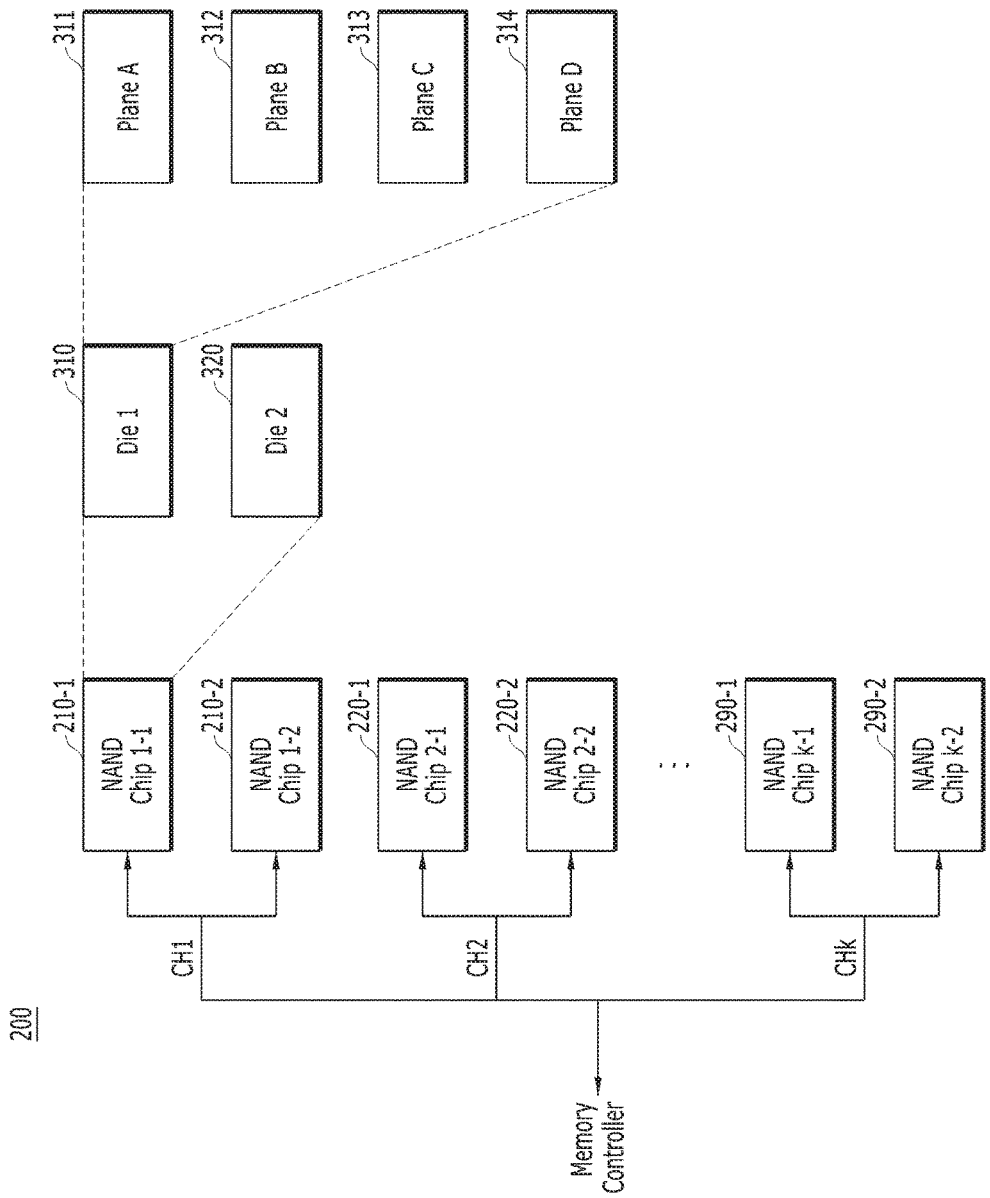
FIG. 3 illustrates the hierarchical structure of a memory device in accordance with an embodiment.

FIG. 3 illustrates the hierarchical structure of a memory device in accordance with an embodiment. By way of example but not limitation, FIG. 3 illustrates the configuration of a nonvolatile memory device such as a NAND-type flash memory which can be used as the memory device 200 illustrated in FIG. 1B.

Referring to FIG. 3, the memory device 200 may include a plurality of pairs of NAND chips 210-1 and 210-2, 220-1 and 220-2, . . . , 290-1 and 290-2. The plurality of NAND chips 210-1 and 21--2, 220-1 and 220-2, . . . , 290-1 and 290-2 may be coupled to a memory controller, for example, the memory controller 100 illustrated in FIG. 1B through a plurality of channels CH1, CH2, . . . , CHk (where k is a positive integer greater than 2). Each pair of the NAND chips is coupled to the memory controller 100 via a corresponding channel. By way of example but not limitation, the NAND chips 210-1 and 210-2 may be coupled to the memory controller 100 through the channel CH1, the NAND chips 220-1 and 220-2 may be coupled to the memory controller 100 through the channel CH2, and the NAND chips 290-1 and 290-2 may be connected to the memory controller 100 through the channel CHk.

The NAND chip 210-1 may include a plurality of memory dies, for example, two memory dies 310 and 320. The memory die 310 may include a plurality of memory planes 311 to 314. Each of the memory planes may include a plurality of memory blocks (not illustrated), and each of the blocks may include a plurality of memory pages (not illustrated).

In another example, the memory die 310 may include two memory planes. The memory plane may include 1024 memory blocks, and each of the blocks may include 512 memory pages.

Figure 4:
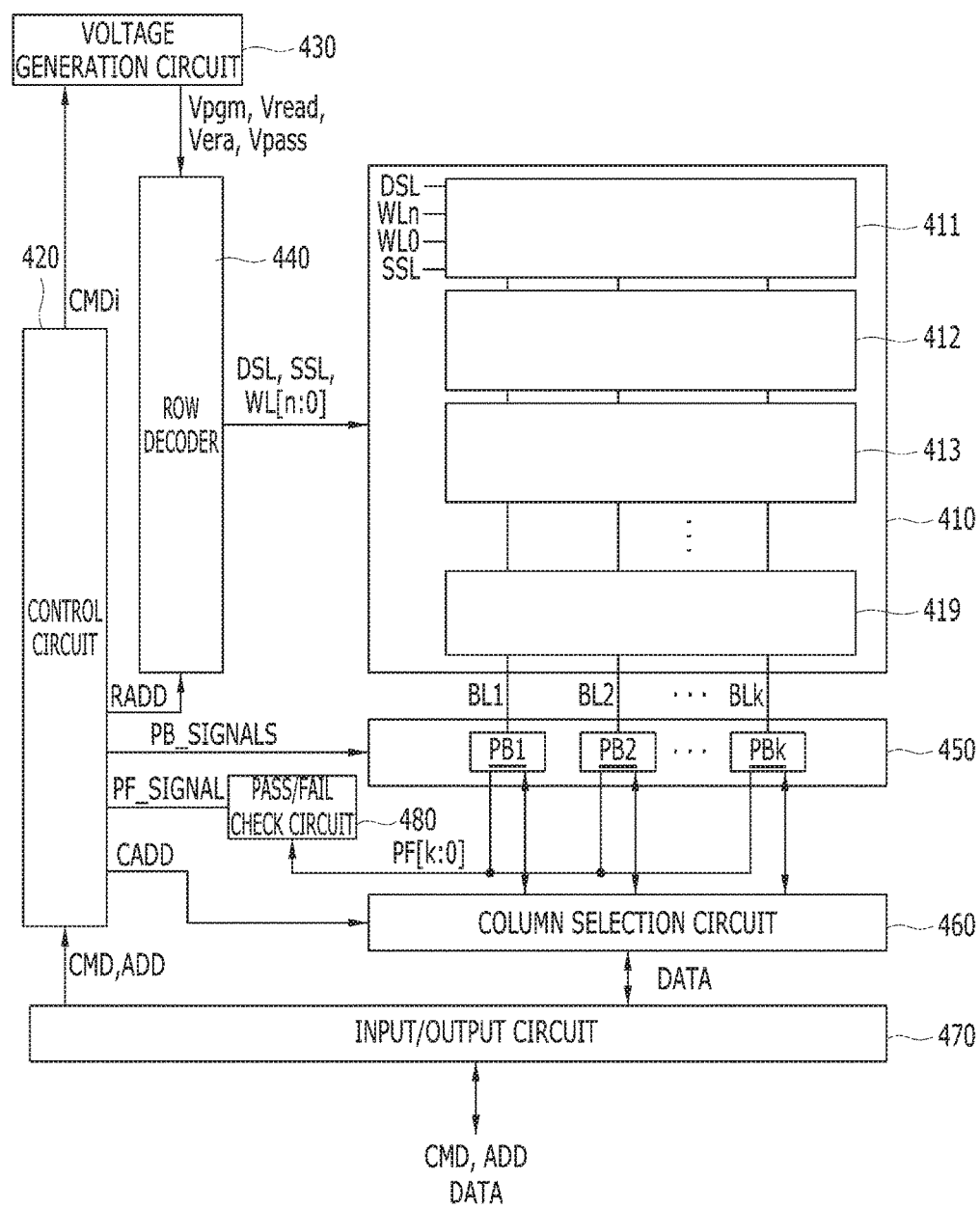
FIG. 4 illustrates a memory die in accordance with an embodiment.
Figure 5:
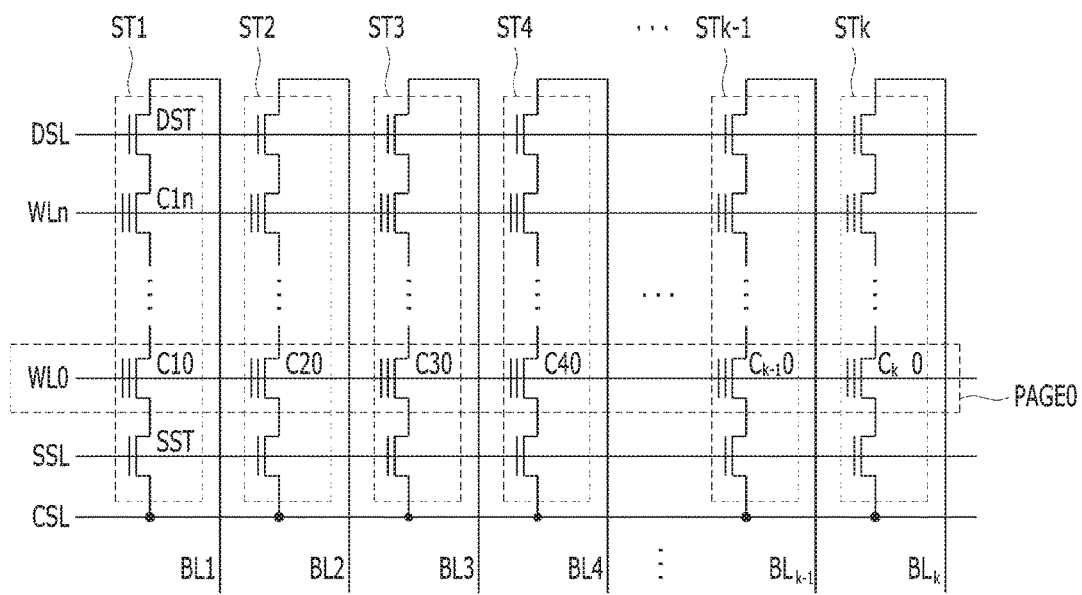
FIG. 5 illustrates a memory block in accordance with an embodiment.

FIG. 4 illustrates a memory die, and FIG. 5 illustrates a memory block in accordance with an embodiment. By way of example but not limitation, FIG. 4 illustrates the configuration of the memory die 310 illustrated in FIG. 3.

Referring to FIG. 4, the memory die 310 may include a memory cell array 410 including a plurality of memory blocks 411 to 419, a voltage generation circuit 430, a row decoder 440, a page buffer group 450, a column selection circuit 460, an input/output circuit 470, a pass/fail check circuit 480, and a control circuit 420. The voltage generation circuit 430, the row decoder 440, the page buffer group 450, the column selection circuit 460, the input/output circuit 470 and the pass/fail check circuit 480 may be configured to a program operation, a read operation, and a test operation on memory cells included in a page selected from the memory blocks 411 to 419, and the control circuit 420 may control the circuit elements 430 to 480. Although FIG. 4 shows memory blocks 411 to 419 as a way of example, the present invention is not limited thereto. That is, any suitable number of memory blocks may be included in the memory cell array 410 depending on design.

In a NAND flash memory device, operation circuits may include the voltage generation circuit 430 serving as a voltage supply circuit, the row decoder 440, the page buffer group 450, the column selection circuit 460, the input/output circuit 470 and the pass/fail check circuit 480. The memory cell array 410 may include a plurality of memory blocks 411 to 419.

FIG. 4 illustrates that the memory die 310 includes components corresponding to a single plane. However, the memory die 310 may include components corresponding to a plurality of planes. By way of example but not limitation, when the memory die 310 includes two planes, the memory die 310 may include two voltage generation circuits, two row decoders, two page buffer groups, two column selection circuits, two input/output circuits and two pass/fail check circuits.

Referring to FIG. 5, the memory block may include a plurality of strings ST1 to STk coupled between the bit lines BL1 to BLk and a common source line CSL (wherein k is a positive integer greater than 4). That is, the strings ST1 to STk may be coupled to the corresponding bit lines BL1 to BLk, and coupled to the common source line CSL in common. The string ST1 may include a source select transistor SST having a source coupled to the common source line CSL, a plurality of memory cells C10 to C1n, and a drain select transistor DST having a drain coupled to the bit line BL1. The memory cells C10 to C1n may be coupled in series between the source select transistor SST and the drain select transistor DST. The gate of the source select transistor SST may be coupled to a source select line SSL, the gates of the memory cells C10 to C1n may be coupled to word lines WL0 to WLn, respectively, and the gate of the drain select transistor DST may be coupled to a drain select line DSL.

In a NAND flash memory device, memory cells included in a memory block may be divided by the physical page or logical page. By way of example but not limitation, the memory cells C10 to Ck0 coupled to a single word line WL0 may constitute a single physical page PAGE0. Even-numbered memory cells Ce10 to Cek0 coupled to a single word line WL0 may constitute a single even physical page, and odd-numbered memory cells Co10 to Cok0 may constitute a single odd physical page. Such a page may be set to the basic unit of a program or read operation. The case where memory cells coupled to a single word line constitute a single physical page will be taken as an example for description.

Referring back to FIGS. 4 and 5, the control circuit 420 may output an internal command signal CMDi for performing a program operation, a read operation, or a test operation in response to a command signal CMD, inputted from an external source, through the input/output circuit 470, and may output PB control signals PB_SIGNALS for controlling page buffers PB1 to PBk in the page buffer group 450 depending on the type of an operation. Furthermore, the control circuit 420 may output a row address signal RADD and a column address signal CADD in response to an address signal ADD inputted from an external source through the input/output circuit 470. The voltage generation circuit 430 and the row decoder 440 which serve as a voltage supply circuit may supply plural operation voltages, used for memory cells, to a selected memory cell block in response to the internal command signal CMDi from the control circuit 420. The voltage generation circuit 430 may output the operation voltages (for example, Vpgm, Vread, Vpass), required for program, read and test operations in the memory cells, to global lines in response to the internal command signal CMDi from the control circuit 420. For the program operation, the voltage generation circuit 430 may output the program voltage Vpgm and the pass voltage Vpass to the plural global lines, such that the program voltage Vpgm is applied to memory cells of a selected page while the pass voltage Vpass is applied to unselected memory cells. For the read operation, the voltage generation circuit 430 may output the read voltage Vread and the pass voltage Vpass to the global lines, such that the program voltage Vread is applied to memory cells of a selected page while the pass voltage Vpass is applied to unselected memory cells. During the test operation related to data storage, the voltage generation circuit 430 may output the program voltage Vpgm and the pass voltage Vpass as in the program operation. During the test operation related to data read, the voltage generation circuit 430 may output the read voltage Vread and the pass voltage Vpass as in the read operation.

The row decoder 440 may couple the global lines to the local lines DSL, WL0 to WLn and SSL in response to the row address signals RADD from the control circuit 420, such that the operation voltages outputted to the global lines from the voltage generation circuit 430 can be transferred to the local lines DSL, WL0 to WLn, and SSL of the memory blocks 411 to 419 selected from the memory cell array 410. Therefore, the program voltage Vpgm or the read voltage Vread may be applied to a local word line (for example, WL0) coupled to a selected cell (for example, C01) from the voltage generation circuit 430 through a global word line. On the other hand, the pass voltage Vpass may be applied to the local word lines (for example, WL1 to WLn) coupled to the unselected cells C11 to Cn1 from the voltage generation circuit 430 through the global word lines. During an erase operation, an erase voltage Vera may be applied to the whole memory cells in a block. Therefore, data may be stored in the selected cell C01 by the program voltage Vpgm, or data stored in the selected cell C01 may be read by the read voltage Vread.

The page buffer group 450 may include the plurality of page buffers PB1 to PBk coupled to the memory cell array 410 through the bit lines BL1 to BLk. In response to the PB control signal PB_SIGNALS from the control circuit 420, the page buffers PB1 to PBk of the page buffer group 450 may selectively precharge the bit lines BL1 to BLk depending on input data in order to store the data in the memory cells C10 to Ck0, or sense the voltages of the bit lines BL1 to BLk in order to read data from the memory cells C10 to Ck0.

By way of example but not limitation, when program data (for example, data '0') is inputted to the page buffer PB1 to store the program data in the memory cell C01, the page buffer PB1 may apply a program permission voltage (for example, ground voltage) to the bit line BL1 of the memory cell C01 in which the program data is to be stored, during a program operation. As a result, the threshold voltage of the memory cell C01 may be raised by the program voltage Vpgm applied to the word line WL0 and the program permission voltage applied to the bit line BL1 during the program operation. Furthermore, when erase data (for example, data '1') is inputted to the page buffer PB1 in order to store the erase data in the memory cell C01, the page buffer PB1 may apply a program inhibition voltage (for example, supply voltage) to the bit line BL1 of the memory cell C01 in which the erase data is to be stored, during a program operation. As a result, although the program voltage Vpgm is applied to the word line WL0 during the program operation, a rise of the threshold voltage of the memory cell C01 may be inhibited by the program inhibition voltage applied to the bit line BL1. As the memory cell has different threshold voltages, different data may be stored in the memory cell.

During a read operation, the page buffer group 450 may precharge all of the selected bit lines (for example, BL1 to BLk). When the read voltage Vread is applied to the selected word line WL0 from the voltage generation circuit 430 and the row decoder 440, the bit lines of memory cells having program data stored therein may maintain the precharged state, and the bit lines of memory cells having erase data stored therein may be discharged. The page buffer group 450 may sense the voltage changes of the bit lines BL1 to BLk, and may latch the data of the memory cells corresponding to the sensing result.

The column selection circuit 460 may select the page buffers PB1 to PBk included in the page buffer group 450 in response to a column address signal CADD outputted from the control circuit 420. That is, the column selection circuit 460 may sequentially transfer data to the page buffers PB1 to PBk in response to the column address signal CADD, in order to store the data in memory cells. Furthermore, the column selection circuit 460 may sequentially select the page buffers PB1 to PBk in response to the column address signal CADD, such that data of memory cells, latched in the page buffers PB1 to PBk, can be outputted to the outside through a read operation.

The input/output circuit 470 may transfer data to the column selection circuit 460 according to control of the control circuit 420, in order to input the data to the page buffer group 450, the data being inputted from an external source so as to be stored in memory cells during a program operation. When the column selection circuit 460 transfers the data from the input/output circuit 470 to the page buffers PB1 to PBk of the page buffer group 450 according to the above-described method, the page buffers PB1 to PBk may store the data in latch circuits thereof. Furthermore, during a read operation, the input/output circuit 470 may output data to the outside, the data being transferred through the column selection circuit 460 from the page buffers PB1 to PBk of the page buffer group 450.

The pass/fail check circuit 480 may output a pass/fail signal PF_SIGNAL in response to comparison result signals PF[1] to PF[k] outputted from the respective page buffers PB1 to PBk during a program verification operation which is performed after the program operation. Specifically, during the program verification operation, the pass/fail check circuit 480 may compare the threshold voltages of memory cells to a target voltage, and may latch the result values in the internal latch circuits of the page buffers PB1 to PBk. The latched comparison result signals PF[1] to PF[k] may be outputted to the pass/fail check circuit 480. The pass/fail check circuit 480 may output the pass/fail signal PF_SIGNAL to the control circuit 420 in response to the comparison result signals PF[1] to PF[k], the pass/fail signal PF_SIG- NAL indicating whether the program operation has been completed. The control circuit 420 may determine whether there is a memory cell of which the threshold voltage is lower than the target voltage, among the memory cells having program data stored therein, in response to the pass/fail signal PF_SIGNAL. According to the determination result, the control circuit 420 may decide whether to perform the program operation again.

As described above, the control circuit 420 may control the voltage generation circuit 430, the row decoder 440, the page buffer group 450 and the column selection circuit 460 to perform program, read and erase operations on the memory cell array 410. The memory cells included in the memory cell array 410 may be embodied in single level cells (SLCs), multi-level cells (MLCs), triple level cells (TLCs) or quad-level cells (QLCs) depending on the number of data bits stored in each of the memory cells.

Figure 6A:
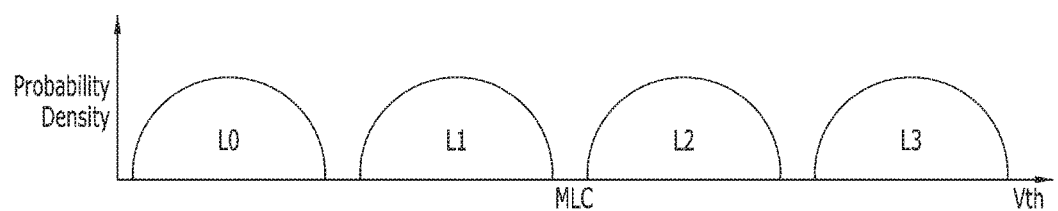
FIGS. 6A to 6C illustrate the distributions of program states or voltage levels of memory cells in a memory device in accordance with an embodiment.
Figure 6B:
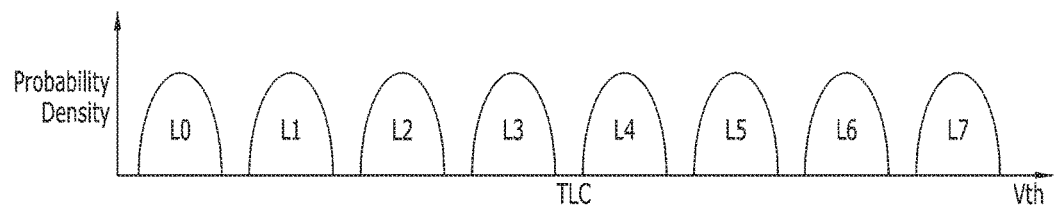
Figure 6C:
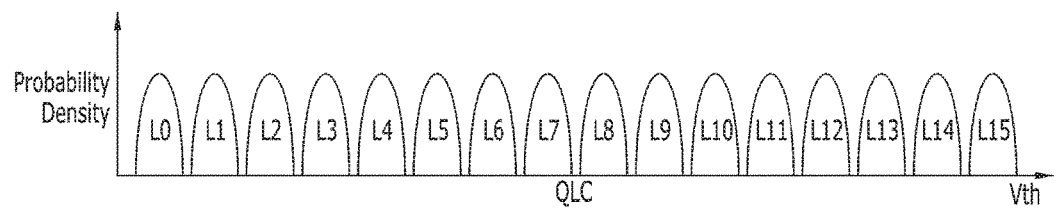

FIGS. 6A to 6C illustrate the distributions of program states or voltage levels of memory cells in a memory device in accordance with an embodiment. By way of example but not limitation, the distributions illustrated in FIGS. 6A to 6C may include the distributions of program states or voltage levels for the memory cell array 410 included in the memory device 200 illustrated in FIGS. 2 to 4. In FIGS. 6A to 6C, the x-axis may represent a threshold voltage Vth, and the y-axis may represent a probability density or the number of cells (# of cells).

Referring to FIG. 6A, when the memory cell array 410 is composed of MLCs, the program states may include four states L0 to L3. Among the states L0 to L3, the state L0 may indicate an erase state. Since the MLCs can be set in one state of the four different states, each of the MLCs may program or store two different bits according to a predetermined coding method. Between the two bits, a first bit corresponding to the upper bit may be referred to as the most significant bit (MSB), and a second bit corresponding to the lower bit may be referred to as the least significant bit (LSB).

Referring to FIG. 6B, when the memory cell array 410 is composed of TLCs, the program states may include eight states L0 to L7. Among the states L0 to L7, the state L0 may indicate the erase state. Since the TLCs can be set in one state of the eight different states, each of the TLCs may program or store three different bits according to a predetermined coding method. Among the three bits, a first bit corresponding to the upper bit may be referred to as the MSB, a second bit corresponding to the central bit may be referred to as the central significant bit (CSB), and a third bit corresponding to the lower bit may be referred as the LSB.

Referring to FIG. 6C, when the memory cell array 410 is composed of QLCs, the program states may include 16 states L0 to L15. Among the states L0 to L15, the state L0 may indicate the erase state. Since the QLCs can be set in one state of the 16 different states, each of the QLCs may program or store four different bits according to a predetermined coding method. Among the four bits, a first bit corresponding to the upper bit may be referred to as the MSB, a second bit corresponding to the high central bit may be referred to as the high central significant bit (HCSB), a third bit corresponding to the low central bit may be referred to as the low central significant bit (LCSB), and a fourth bit corresponding to the lower bit may be referred to as the LSB.

Figure 7:
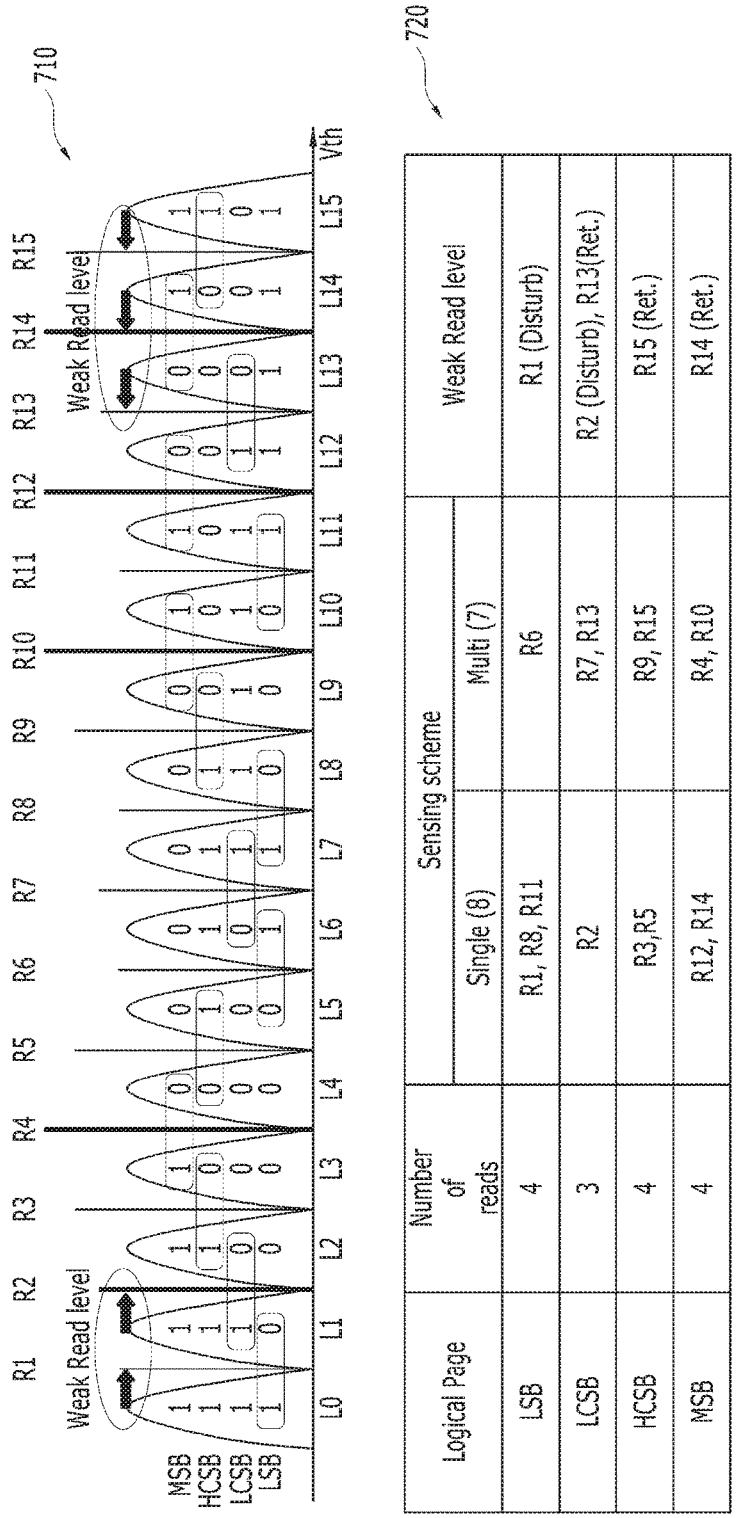
FIG. 7 illustrates program and read operations on a plurality of memory cells in accordance with an embodiment.

FIG. 7 illustrates program and read operations on a plurality of memory cells in accordance with an embodiment. By way of example but not limitation, the program and read operations illustrated in FIG. 7 may include program and read operations performed on the memory cell array 410 by the voltage generation circuit 430, the row decoder 440, the page buffer group 450, and the column selection circuit 460, which are all controlled by the control circuit 420 illustrated in FIGS. 2 to 4.

In FIG. 7, reference numeral 710 represents a graph illustrating the distributions of states or voltage levels, which the memory cells (for example, QLCs) may have, according to the results of the program operations, and voltages for reading the programmed memory cells. Furthermore, L0 to L15 may represent 16 program states or voltage levels that the QLCs may have, and R1 to R15 may represent voltage levels for reading the QLCs. Since the QLCs are set in one state of the 16 different states, each of the QLCs may program or store four different bits according to the predetermined coding method. In each of the voltage levels, the upper bit may correspond to an MSB page, the central high bit may correspond to an HCSB page, the central low bit may correspond to an LCSB page, and the lower bit may correspond to an LSB page. At this time, data based on the results of the program operations for proper cell distribution and read performance may be mapped or allocated to the 16 voltage levels L0 to L15.

The states of the QLC cells may be mapped according to a predetermined QLC logic code [F-E-C-8-0-4-5-7-6-2-A-B-3-1-9-D]. In various examples, the QLC logic code may include a gray code in which the values of adjacent voltage levels have a difference of only one bit. By way of example but not limitation, data having a binary value of "1111(F)" from the upper bit to the lower bit may be allocated to a first voltage level L0, data having a binary value of "1110(E)" from the upper bit to the lower bit may be allocated to a second voltage level L1, data having a binary value of "1100(C)" from the upper bit to the lower bit may be allocated to a third voltage level L2, and data having a binary value of "1000(8)" from the upper bit to the lower bit may be allocated to a fourth voltage level L3. Furthermore, data having a binary value of "0000(0)" from the upper bit to the lower bit may be allocated to a fifth voltage level L4, data having a binary value of "0100(4)" from the upper bit to the lower bit may be allocated to a sixth voltage level L5, data having a binary value of "0101(5)" from the upper bit to the lower bit may be allocated to a seventh voltage level L6, and data having a binary value of "0111(7)" from the upper bit to the lower bit may be allocated to an eighth voltage level L7. Furthermore, data having a binary value of "0110(6)" from the upper bit to the lower bit may be allocated to a ninth voltage level L8, data having a binary value of "0010(2)" from the upper bit to the lower bit may be allocated to a tenth voltage level L9, data having a binary value of "1010(A)" from the upper bit to the lower bit may be allocated to a eleventh voltage level L10, and data having a binary value of "1011(B)" from the upper bit to the lower bit may be allocated to a twelfth voltage level L11. Furthermore, data having a binary value of "0011(3)" from the upper bit to the lower bit may be allocated to thirteenth voltage level L12, data having a binary value of "0001(1)" from the upper bit to the lower bit may be allocated to a fourteenth voltage level L13, data having a binary value of "1001(9)" from the upper bit to the lower bit may be allocated to a fifteenth voltage level L14, and data having a binary value of "1101 (D)" from the upper bit to the lower bit may be allocated to a sixteenth voltage level L15.

Reference numeral 720 represents a table indicating information related to read operations on the 16 (first to sixteenth) voltage levels L0 to L15.

The logical LSB page containing the first to sixteenth voltage levels L0 to L15 (i.e., 16-bit data) may be read or accessed through four read operations. The LSB page may be read through single sensing operations, each using the read voltages R1, R8, and R11, and a multi-sensing operation using the read voltage R6. In this case, the read voltage R1 may have a weak read level due to read disturbance.

The logical LCSB page including the first to sixteenth voltage levels L0 to L15 may be read or accessed through three read operations. The LCSB page may be read through a single sensing operation using the read voltage R2 and multi-sensing operations, each using the read voltages R7 and R13. In this case, the read voltage R2 may have a weak read level because of disturb, and the read voltage R13 may have a weak read level due to retention error.

The logical HCSB page storing the first to sixteenth voltage levels L0 to L15 may be read through four read operations. The HCSB page may be read through single sensing operations, each using the read voltages R3 and R5, and multi-sensing operations, each using the read voltages R9 and R15. In this example, the read voltage R15 may have a weak read level caused by retention.

The logical MSB page for the first to sixteenth voltage levels L0 to L15 may be read through four read operations. The MSB page may be read through single sensing operations, each using the read voltages R12 and R14, and multi-sensing operations, each using the read voltages R4 and R10. The read voltage R14 may have a weak read level due to retention.

The above-described QLC logic code used for a program operation on memory cells may be set in consideration of the following conditions. First, the QLC logic code may be set in consideration of ECC efficiency. Second, the QLC logic code may be set in such a manner that the numbers of read operations on the respective logical pages are distributed. Third, the QLC logic code may be set in such a manner that multi-sensing read levels are minimized. Fourth, the QLC logic code may be set in such a manner that weak read levels are distributed to the respective pages.

The following examples show a method for improving cell distribution and read performance by performing a program operation on memory cells using the QLC logic code which is set in consideration of the above-described conditions. The examples can improve cell distribution based on the less source line (SL) bouncing effect, and can improve read timing (tR) performance through the single sensing operation.

Figure 8:
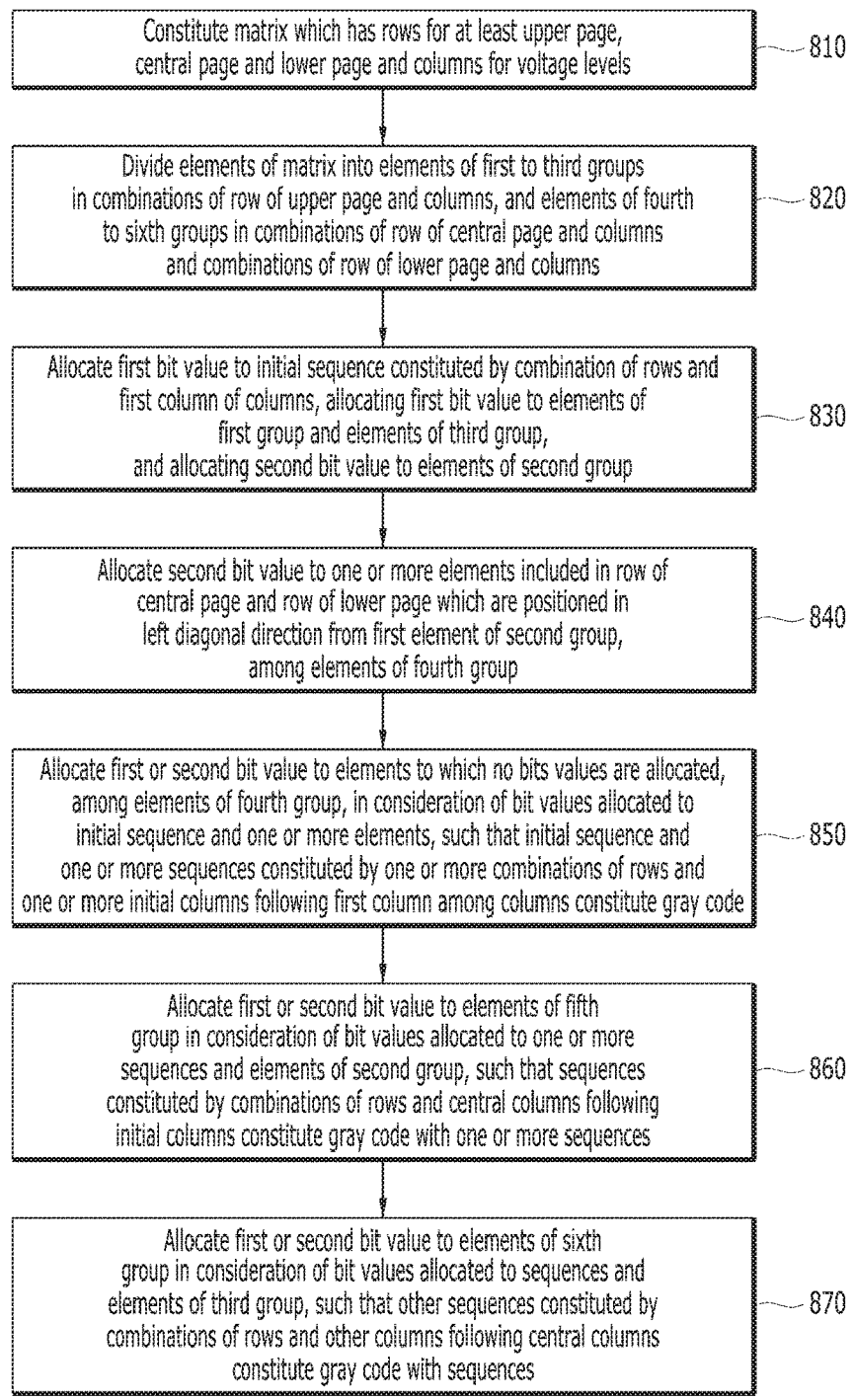
FIG. 8 is a flowchart describing an operation of programming a plurality of memory cells in accordance with embodiments in accordance with an embodiment.
Figure 9:
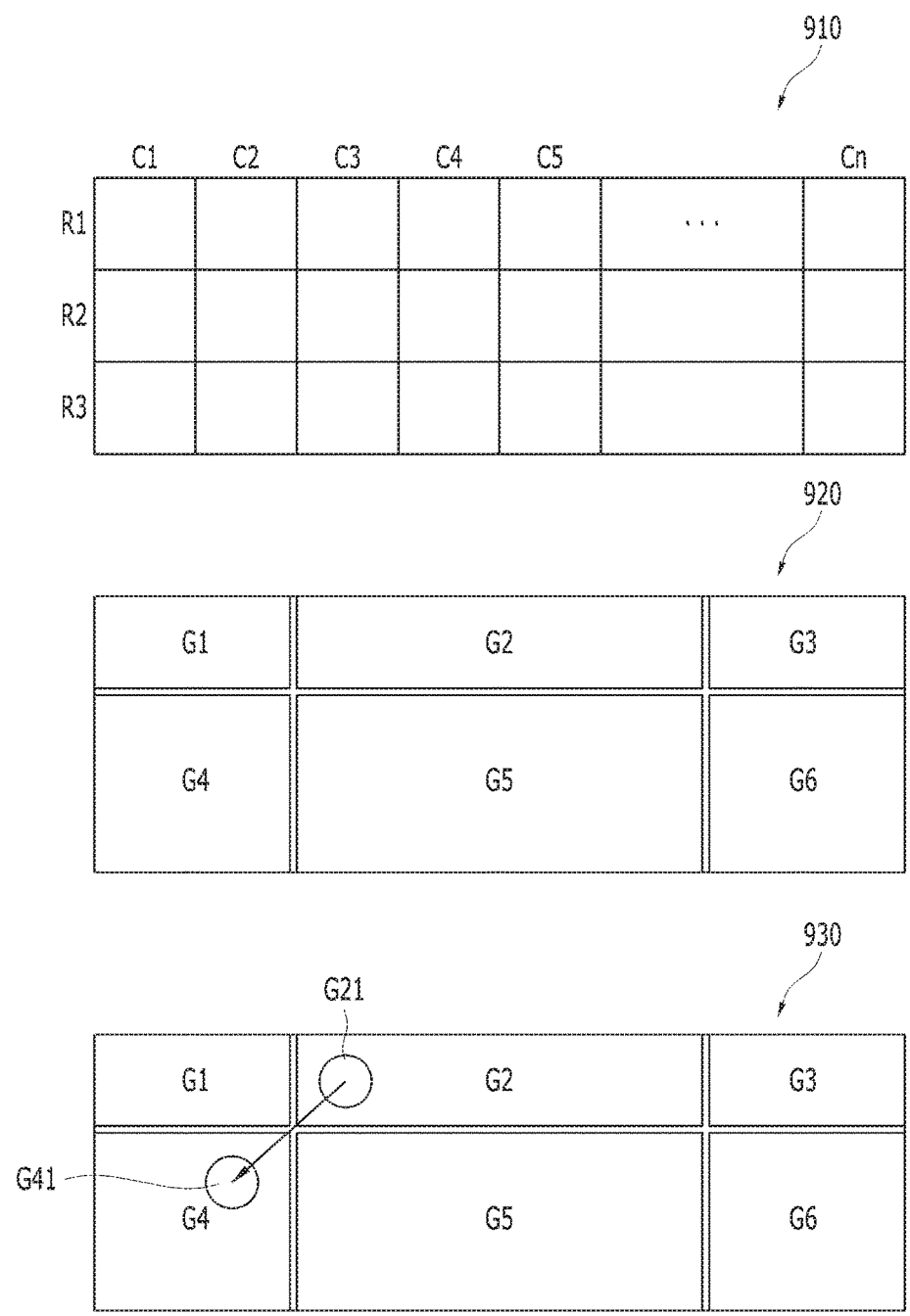
FIG. 9 illustrates a part of processes of the operation of programming a plurality of memory cells in accordance with an embodiment.

FIG. 8 is a flowchart describing an operation of programming a plurality of memory cells in accordance with embodiments, and FIG. 9 illustrates a part of processes for the operation of programming a plurality of memory cells in accordance with an embodiment. By way of example but not limitation, the operation flow illustrated in FIG. 8 may indicate a program operation in which the control circuit 420 illustrated in FIGS. 2 to 4 controls the voltage generation circuit 430, the row decoder 440, the page buffer group 450, and the column selection circuit 460 to perform on the memory cell array 410.

Referring to FIG. 8, the control circuit 420 may constitute a matrix which has rows for at least an upper page, a central page, and a lower page and columns for a plurality of voltage levels, at step 810.

By way of example but not limitation, the control circuit 420 may constitute a matrix which has rows R1 to R3 for an upper page, a central page and a lower page and columns C1 to Cn for a plurality of voltage levels (910 of FIG. 9). When the plurality of memory cells are TLCs, the matrix may have the rows R1 to R3 for the upper page for the MSB, the central page for the CSB and the lower page for the LSB. When the memory cells are QLCs, the matrix may have rows for an upper page for the MSB, a first central page for the HCSB, a second central page for the LCSB, and a lower page for the LSB.

The control circuit 420 may divide elements of the matrix into first to third groups in combinations of the row of the upper page and the columns and elements of fourth to sixth groups in combinations of the row of the central page and the columns and combinations of the row of the lower page and the columns, at step S820.

By way of example but not limitation, the control circuit 420 may divide elements of the matrix into the first to third groups G1 to G3 in the combinations of the row R1 of the upper page and the columns C1 to Cn and other elements of the matrix into the fourth to sixth groups G4 to G6 in the combinations of the row R2 of the central page and the columns C1 to Cn and in the combinations of the row R3 of the lower page and the columns C1 to Cn (920 of FIG. 9). In various embodiments including the embodiment illustrated in FIG. 9, the control circuit 420 may divide the row of the upper page R1 into the three groups: G1, G2, and G3, with each group including a non-overlapping subset of the columns C1 to Cn, based on predetermined read points for the row R1 of the upper page. Furthermore, the control circuit 420 may form fourth to sixth groups, G4, G5, and G5 from matrix elements as follows. Each group G4, G5, and G6 includes R2 of the central page and R3 of the lower page and a select non-overlapping subset of the columns C1 to Cn. Such groupings are provided by way of example. Other groupings consistent with the disclosure may be used.

The control circuit 420 may allocate a first bit value to an initial sequence constituted by a combination of the rows and the first column, allocate the first bit value to the elements of the first group and the elements of the third group, and allocate a second bit value to the elements of the second group, at step 830. By way of example but not limitation, the first bit value may be set to a logic level "0", and the second bit value may be set to a logic level "1".

The control circuit 420 may allocate the second bit value to one or more elements included in the row of the central page and the row of the lower page which are positioned in the left diagonal direction from the first element of the second group, among the elements of the fourth group, at step 840.

By way of example but not limitation, the control circuit 420 may allocate the second bit value to one or more elements G41, among the elements of the second group G2, included in the row of the central page and the row of the lower page which are positioned in the left diagonal direction from the first element G21 of the second group G2 (930 of FIG. 9).

The control circuit 420 may allocate the first or second bit value to the elements to which no bits values are allocated, among the elements of the fourth group, in consideration of the bit values allocated to the initial sequence and the one or more elements, such that the initial sequence and one or more sequences constituted by one or more combinations of the rows and one or more initial columns following the initial sequence constitute a gray code, at step 850.

The control circuit 420 may allocate the first or second bit value to the elements of the fifth group in consideration of the bit values allocated to the one or more sequences and to the elements of the second group, such that a plurality of sequences constituted by combinations of the rows and the central columns following the initial column constitute a gray code with the one or more sequences, at step 860.

Finally, the control circuit 420 may allocate the first or second bit value to the elements of the sixth group in consideration of the bit values allocated to the plurality of sequences and to the elements of the third group, such that the other sequences constituted by combinations of the rows and the other columns following the central columns constitute a gray code with the plurality of sequences, at step 870.

Figure 10:
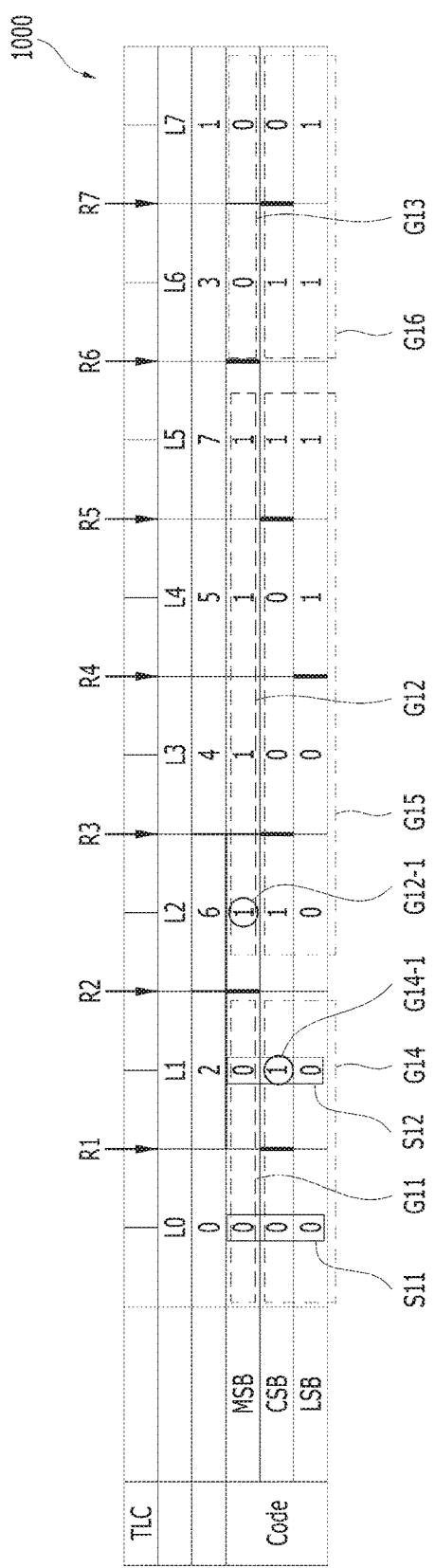
FIG. 10 illustrates an operation of programming a plurality of memory cells in accordance with an embodiment.

FIG. 10 illustrates an operation of programming a plurality of memory cells in accordance with an embodiment. By way of example but not limitation, the operation flow illustrated in FIG. 10 may indicate a program operation performed on the memory cell array 410 including a plurality of TLCs by the control circuit 420, illustrated in FIGS. 2 to 4, which controls the voltage generation circuit 430, the row decoder 440, the page buffer group 450 and the column selection circuit 460.

Referring to FIG. 10, the control circuit 420 may constitute a matrix 1000 which has rows for an MSB page corresponding to an upper page, a CSB page corresponding to a central page, and an LSB page corresponding to a lower page and columns L0 to L7 for a plurality of voltage level distributions.

The control circuit 420 may divide elements of the matrix into first to third groups G11 to G13 in combinations of the row of the upper page MSB and three non-overlapping subsets of columns L0 to L7 and into fourth to sixth groups G14 to G16 in combinations of the rows of the central page CSB and the lower page LSB and three non-overlapping subsets of columns L0 to L7, as shown in FIG. 10. Such groupings are provided by way of example. Other groupings consistent with the disclosure may be used.

By way of example but not limitation, the control circuit 420 may divide elements of the matrix into the elements of the first to third groups G11 to G13 as follows. Each of G11 to G13 includes as part of its combination the row of the upper page MSB. G11 further includes the columns L0 to L1, G12 further includes the columns L2 to L5, and G13 further includes the columns L6 to L7. The fourth to sixth groups G14 to G16 each include the row of the central page CSB and the row of the lower page LSB. G14 further includes the columns L0 to L1, G15 further includes the columns L2 to L5, and G16 further includes the columns L6 to L7.

In various examples, the control circuit 420 may divide elements of the matrix into the first group G11, the second group G12, and the third group G13, based on read voltages R2 and R6 as predetermined read points for the row of the upper page MSB. That is, the control circuit 420 may allocate read points for the upper bit as the read voltages R2 and R6 corresponding to predetermined sizes of read points (for example, 4 KB/8 KB of FIG. 11). In this manner, the elements of the combinations of the row of the upper page MSB and the columns L0 to L7 may be divided into the elements of the first group G11, the elements of the second group G12 and the elements of the third group 13.

The control circuit 420 may divide elements of the matrix into the fourth group G14, fifth group G15, and the sixth group G16, so that the elements of G14, G15, and G16 correspond to the elements of G11, G12, and G13, respectively.

The control circuit 420 may allocate the first bit value to an initial sequence S11 constituted by a combination of the first column L0 and the rows, allocate the first bit value to the elements of the first group G11 and the elements of the third group G13, and allocate the second bit value to the elements of the second group G12. By way of example but not limitation, the first bit value may be set to a logic level "0", and the second bit value may be set to a logic level "1".

The control circuit 420 may allocate the second bit value (for example, logic "1") to one or more elements, among elements of the fourth group G14, in the row of the central page CSB and the row of the lower page LSB, which elements are positioned in the left diagonal direction from the first element G12-1 of the second group G12. By way of example but not limitation, the control circuit 420 may allocate the second bit value (for example, logic "1") to the one or more elements G14-1, among elements of the fourth group G14, in the row of the central page CSB and/or the row of the lower page LSB, which element(s) are positioned in the left diagonal direction from the first element G12-1.

In other words, the control circuit 420 may arrange a code sequence value (for example, logic "1") for the column L2 after the lower read point R2 for the MSB, in the left downward diagonal direction. In this case, the control circuit 420 may arrange the code sequence values before the initial code sequence S11.

The control circuit 420 may allocate the first or second bit value to the elements to which no bits values are allocated, among the elements of the fourth group G14, in consideration of bit values allocated to the initial sequence S11 and the one or more elements G14-1, such that the initial sequence S11 and one or more sequences S12 constituted by combinations of the rows and the one or more initial columns L1 following the first column L0 of the columns L0 to L7 constitute a gray code, as shown by way of example in FIG. 10. That is, the control circuit 420 may allocate a bit value of "0" to the element corresponding to the column L1 and the row of the lower page LSB. Therefore, the value for the code sequence S12 of the column L1 may be decided.

Then, the control circuit 420 may allocate the first or second bit value to the elements of the fifth group G15 in consideration of the bit values allocated to the one or more sequences S12 and the elements of the second group G12, such that a plurality of sequences constituted by combinations of the rows and the central columns L2 to L5 constitute a gray code with the one or more sequences S12, as shown by way of example in FIG. 10. As such, the bit values of the CSB and the LSB included between the read points R2 and R6 may be allocated to constitute a gray code. As a result, the values for the code sequences of the columns L2 to L5 may be decided.

Finally, the control circuit 420 may allocate the first or second bit value to the elements of the sixth group G16 in consideration of the bit values allocated to the plurality of sequences and the elements of the third group G13, such that the other sequences constituted by combinations of the rows and the other columns L6 and L7 following the central columns L2 to L5 constitute a gray code with the plurality of sequences, as shown by way of example in FIG. 10. Therefore, the values for the code sequences of the columns L6 and L7 may be decided.

As a result, the control circuit 420 may generate the code sequences for the voltage levels L0 to L7 of the plurality of memory cells. Since the code sequences illustrated in FIG. 10 are generated according to the gray coding method, the code sequences of adjacent voltage levels may have a difference of a single bit. Table 1 shows the generation results of the code sequences.

TABLE 1

| Voltage Level | Code Sequence (binary value) | | | Code Sequence (decimal value) |
|---|---|---|---|---|
| | MSB | CSB | LSB | |
| L0 | 0 | 0 | 0 | 0 |
| L1 | 0 | 1 | 0 | 2 |
| L2 | 1 | 1 | 0 | 6 |
| L3 | 1 | 0 | 0 | 4 |
| L4 | 1 | 0 | 1 | 5 |
| L5 | 1 | 1 | 1 | 7 |
| L6 | 0 | 1 | 1 | 3 |
| L7 | 0 | 0 | 1 | 1 |

FIG. 11 illustrates an operation of reading a plurality of memory cells in accordance with an embodiment. By way of example but not limitation, the operation illustrated in FIG. 11 may indicate a read operation which the control circuit 420 illustrated in FIGS. 2 to 4 controls the voltage generation circuit 430, the row decoder 440, the page buffer group 450 and the column selection circuit 460 to perform on the memory cell array 410 including a plurality of TLCs. The operation illustrated in FIG. 11 may indicate a read operation corresponding to the program operation illustrated in FIG. 10.

Referring to FIG. 11, the MSB page may be read or accessed by the read voltages R2 and R6 at two read points. The read operation by the read voltage R2 may be performed through a single sensing method, while the read operation by the read voltage R6 may be performed through a multi-sensing method. That is, the read operation based on the read voltage R2 may be performed once, while the read operation based on the read voltage R6 may be performed twice. In various embodiments, the single sensing operation may be performed at a predetermined maximum page buffer (PB) size (for example, 4 KB). By way of example but not limitation, MSB page data of 4 KB may be read or outputted by the read voltage R2, and MSB page data of 4 KB may be read twice by the read voltage R6 or MSB page data of 8 KB may be read once.

The CSB page may be read or accessed by the read voltages R1, R3, R5, R7 at four read points. The read operations by the read voltages R1, R3, R5, R7 may be performed through the single sensing operation. That is, each of the read operations by the read voltages R1, R3, R5, R7 may be performed once. In various embodiments, the single sensing operation may be performed at a predetermined maximum PB size (for example, 4 KB). By way of example but not limitation, CSB page data of 2 KB may be read by the read voltage R1, CSB page data of 4 KB may be read by the read voltage R3, CSB page data of 4 KB may be read by the read voltage R5, and CSB page data of 4 KB may be read by the read voltage R7.

The LSB page may be read by the read voltage R4 at one read point. The read operation by the read voltage R4 may be performed through the multi-sensing operation. That is, the read operation by the read voltage R4 may be performed twice. In various embodiments, the single sensing operation may be performed at the predetermined maximum PB size (for example, 4 KB). By way of example but not limitation, LSB page data of 4 KB may be read twice by the read voltage R4, or LSB page data of 8 KB may be read once.

In short, the read operation illustrated in FIG. 11 may include a total of nine read operations including three read operations for the MSB page data, four read operations for the CSB page data, and two read operations for the LSB page data. The read operations by five read voltages R1, R2, R3, R5, R7 may be performed through the single sensing method, but the read operations by two read voltages R4, R6 may be performed through the multi-sensing method. That is, the embodiment illustrated in FIGS. 10 and 11 can minimize the read voltage levels for multi-sensing, and can distribute the number of read operations for the respective logical pages, thereby improving cell distribution and read timing performance.

Figure 12:
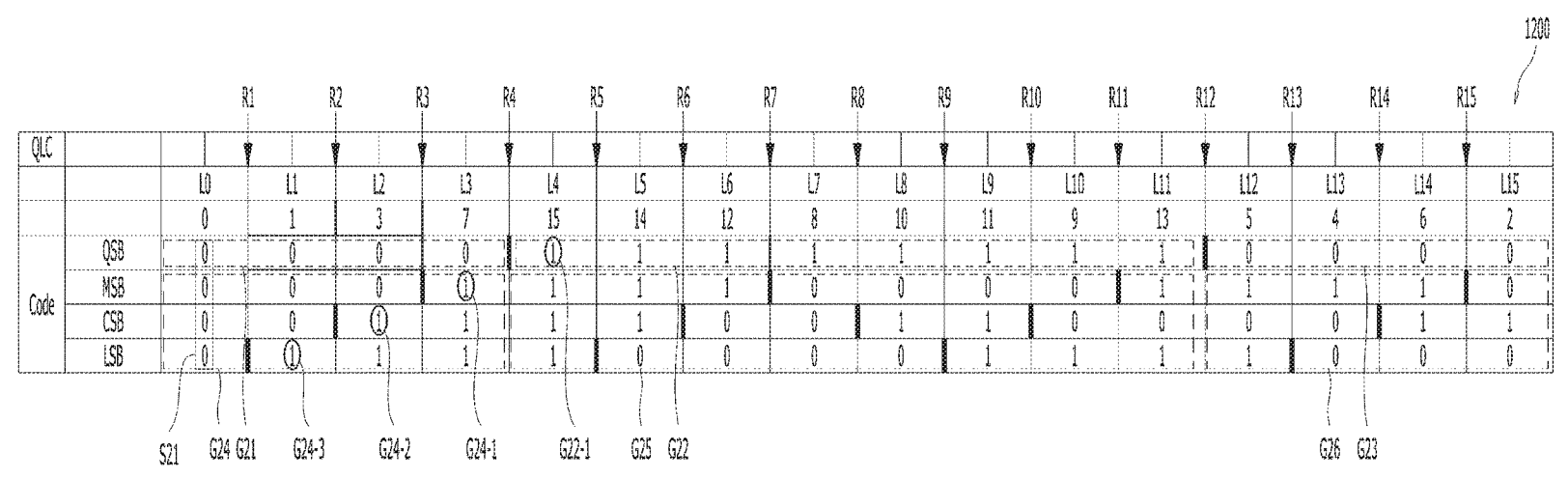

FIG. 12 illustrates an operation of programming a plurality of memory cells in accordance with another embodiment. By way of example but not limitation, the operation illustrated in FIG. 12 may indicate a program operation performed on the memory cell array 410 including a plurality of QLCs by the control circuit 420, illustrated in FIGS. 2 to 4, which controls the voltage generation circuit 430, the row decoder 440, the page buffer group 450 and the column selection circuit 460.

Referring to FIG. 12, the control circuit 420 may constitute a matrix 1000 which has rows for a quad significant bit (QSB) page corresponding to the uppermost page, an MSB page corresponding to the upper page, a CSB page corresponding to the central page, and an LSB page corresponding to the lower page and columns L0 to L15 for a plurality of voltage levels.

The control circuit 420 may divide elements of the matrix into first to third groups G21 to G23 in combinations of the row of the uppermost page QSB and the columns L0 to L15, and into fourth to sixth groups G24 to G26 in combinations of the rows of the upper page MSB, the central page CSB and the lower page LSB, and the columns L0 to L15.

By way of example but not limitation, the control circuit 420 may divide elements of the matrix into first to third groups G21 to G23, each group including the combination of the row of the uppermost page QSB and select, non-overlapping subsets of columns L0 to L15, and into fourth to sixth groups G24 to G26, each group including the combination of the rows of the upper page MSB, the central page CSB, the lower page LSB and select, non-overlapping subsets of columns L0 to L15, as shown in FIG. 12.

In various embodiments, the control circuit 420 may determine the specific configuration of each of the groups G21, G22, and G23, based on read voltages R4, R12 as predetermined read points for the row of the uppermost page QSB. That is, the control circuit 420 may allocate read points for the uppermost bit as the read voltages R4, R12 corresponding to predetermined sizes of read points (for example, 4 KB/8 KB of FIG. 11). In this manner, the elements in the combinations of the row of the uppermost page QSB and the columns L0 to L15 may be divided into the first group G21, the second group G22 and the third group 23.

The control circuit 420 may form groups G24, G25 and G26, so that their elements correspond to the elements of groups G21, G22, and G23, respectively.

The control circuit 420 may allocate the first bit value to the initial sequence S21 constituted by a combination of the first column L0 of the columns L0 to L15 and the rows, allocate the first bit value to the elements of the first group G21 and the elements of the third group G23, and allocate the second bit value to the elements of the second group G22. By way of example but not limitation, the first bit value may be set to a logic level "0", and the second bit value may be set to a logic level "1".

The control circuit 420 may allocate the second bit value (for example, logic "1") to one or more elements of the fourth group G24 in the row of the upper page MSB, the row of the central page CSB and the row of the lower page LSB, which element(s) are positioned in the left diagonal direction from the first element G22-1. By way of example but not limitation, the control circuit 420 may allocate the second bit value (for example, logic "1") to the elements G24-1, G24-2 and G24-3 in the row of the upper page MSB, the row of the central page CSB and the row of the lower page LSB which are positioned in the left diagonal direction from the first element G22-1.

In other words, the control circuit 420 may arrange the code sequence value (for example, logic "1") for the column L4 after the lower read point R4 for the QSB, in the left downward diagonal direction. The control circuit 420 may perform an operation of arranging the code sequence values before the initial code sequence S21.

The control circuit 420 may allocate the first or second bit value to the elements to which no bits values are allocated, among the elements of the fourth group G24, in consideration of the bit values allocated to the initial sequence S21 and the one or more elements G24-1, G24-2 and G24-3, such that the initial sequence S21 and sequences constituted by combinations of the rows and one or more initial columns L1 to L3 following the first column L0 of the columns L0 to L15 constitute a gray code. That is, the control circuit 420 may allocate a bit value of "0" to the element corresponding to the column L1 and the row of the upper page MSB and the element corresponding to the column L1 and the row of the central page CSB. Therefore, the value for the code sequence of the column L1 may be decided.

The control circuit 420 may allocate a bit value of "0" to the element corresponding to the column L2 and the row of the upper page MSB, and may allocate a bit value of "1" to the element corresponding to the column L2 and the lower page LSB. Therefore, the value for the code sequence of the column L2 may be decided. Furthermore, the control circuit 420 may allocate a bit value of "1" to the element corresponding to the column L3 and the row of the central page CSB and the element corresponding to the column L3 and the row of the lower page LSB. Therefore, the value for the code sequence of the column L3 may be decided.

The control circuit 420 may allocate the first or second bit value to the elements of the fifth group G25 in consideration of the bit values allocated to the sequence for the column L3 and the elements of the second group G22, such that a plurality of sequences constituted by combinations of the rows and the central columns L4 to L11 following the initial column L3 constitute a gray code with the sequences for the columns L1 to L3. As such, the bit values of the MSB, CSB and LSB which are included between the read points R4, R12 may be allocated to constitute a gray code. As a result, the values for the code sequences of the columns L4 to L11 may be decided.

Finally, the control circuit 420 may allocate the first or second bit value to the elements of the sixth group G26 in consideration of the bit values allocated to the plurality of sequences and the elements of the third group G23, such that the other sequences constituted by the combinations of the rows and the other columns L12 to L15 following the central columns L4 to L11 constitute a gray code with the plurality of sequences. Therefore, the values for the code sequences of the columns L12 to L15 may be decided.

As a result, the control circuit 420 may generate the code sequences for the voltage levels L0 to L15 of the plurality of memory cells. Since the code sequences illustrated in FIG. 12 are generated according to the gray coding method, the code sequences of adjacent voltage levels may have a difference of a single bit. Table 2 shows the generation results of the code sequences.

TABLE 2

| Voltage Level | Code Sequence (binary value) | | | | Code Sequence (decimal value) |
|---|---|---|---|---|---|
| | QSB | MSB | CSB | LSB | |
| L0 | 0 | 0 | 0 | 0 | 0 |
| L1 | 0 | 0 | 0 | 1 | 1 |
| L2 | 0 | 0 | 1 | 1 | 3 |
| L3 | 0 | 1 | 1 | 1 | 7 |
| L4 | 1 | 1 | 1 | 1 | 15 |
| L5 | 1 | 1 | 1 | 0 | 14 |
| L6 | 1 | 1 | 0 | 0 | 12 |
| L7 | 1 | 0 | 0 | 0 | 8 |
| L8 | 1 | 0 | 1 | 0 | 10 |
| L9 | 1 | 0 | 1 | 1 | 11 |
| L10 | 1 | 0 | 0 | 1 | 9 |
| L11 | 1 | 1 | 0 | 1 | 13 |
| L12 | 0 | 1 | 0 | 1 | 5 |
| L13 | 0 | 1 | 0 | 0 | 4 |
| L14 | 0 | 1 | 1 | 0 | 6 |
| L15 | 0 | 0 | 1 | 0 | 2 |

FIG. 13 illustrates an operation of reading a plurality of memory cells in accordance with another embodiment. For example, the operation illustrated in FIG. 13 may indicate a read operation performed on the memory cell array 410 including a plurality of QLCs by the control circuit 420, illustrated in FIGS. 2 to 4, which controls the voltage generation circuit 430, the row decoder 440, the page buffer group 450 and the column selection circuit 460. The operation illustrated in FIG. 13 may indicate a read operation corresponding to the program operation illustrated in FIG. 12.

Referring to FIG. 13, the QSB page may be read by read voltages R4, R12 at two read points. The read operation by the read voltage R4 may be performed through a single sensing method, while the read operation by the read voltage R12 may be performed through a multi-sensing method. That is, the read operation by the read voltage R4 may be performed once, while the read operation by the read voltage R12 may be performed twice. In various embodiments, the single sensing operation may be performed at the predetermined maximum PB size (for example, 4 KB). By way of example but not limitation, QSB page data of 4 KB may be read by the read voltage R4, and QSB page data of 4 KB may be read twice by the read voltage R12 or QSB page data of 8 KB may be read once.

The MSB page may be read by read voltages R3, R7, R11, R15 at four read points. The read operations by the read voltages R3, R7, R11, R15 may be performed through the single sensing method. That is, each of the read operations by the read voltages R3, R7, R11, R15 may be performed once. In various embodiments, the single sensing operation may be performed at the predetermined maximum PB size (for example, 4 KB). By way of example but not limitation, MSB page data of 3 KB may be read by the read voltage R3, MSB page data of 4 KB may be read by the read voltage R7, MSB page data of 4 KB may be read by the read voltage R11, and MSB page data of 4 KB may be read The CSB page may be read by read voltages R2, R6, R8, R10, R14 at five read points. The read operations by the read voltages R2, R6, R8, R10, R14 may be performed through the single sensing method. That is, each of the read operations by the read voltages R2, R6, R8, R10, R14 may be performed once. In various embodiments, the single sensing operation may be performed at the predetermined maximum PB size (for example, 4 KB). By way of example but not limitation, CSB page data of 2 KB may be read by the read voltage R2, CSB page data of 4 KB may be read by the read voltage R6, CSB page data of 2 KB may be read by the read voltage R8, CSB page data of 02 KB may be read by the read voltage R10, and CSB page data of 4 KB may be read by the read voltage R14.

The LSB page may be read by read voltages R1, R5, R9 and R13 at four read points. At this time, the read operations by the read voltages R1, R5, R9, R13 may be performed through the single sensing method. That is, each of the read operations by the read voltages R1, R5, R9, R13 may be performed once. In various embodiments, the single sensing operation may be performed at the predetermined maximum PB size (for example, 4 KB). By way of example but not limitation, LSB page data of 1 KB may be read by the read voltage R1, LSB page data of 4 KB may be read by the read voltage R5, LSB page data of 4 KB may be read by the read voltage R9, and LSB page data of 4 KB may be read by the read voltage R13.

In short, the read operation illustrated in FIG. 13 may include a total of 16 read operations including three read operations for the QSB page data, four read operations for the MSB page data, five read operations for the CSB page data, and four read operations for the LSB page data. The read operations by 14 read voltages R1 to R11, R13 to R15 may be performed through the single sensing method, but only the read operation by one read voltage R12 may be performed through the multi-sensing method. That is, the embodiment illustrated in FIGS. 12 and 13 can minimize read voltage levels for multi-sensing, and distribute the number of read operations for the respective logical pages, thereby improving cell distribution and read timing performance. In accordance with embodiments, the memory device may determine the coding method capable of programming a plurality of memory cells, such that the read voltage levels for multi-sensing can be minimized, and the number of read operations for the respective logical pages can be distributed. Therefore, such embodiments can improve the cell distribution for the plurality of memory cells and the performance of read timing.

Although various embodiments have been described for illustrative purposes, it will be apparent to those skilled in the art in light of the foregoing description that various changes and modifications may be made without departing from the spirit and scope of the invention as defined in the following claims.

What is claimed is:

1. A method for programming a memory device including a plurality of memory cells, comprising:
constituting a matrix which has rows for at least an upper page, a central page, and a lower page and columns for a plurality of voltage levels;
dividing elements of the matrix into first to third groups in combinations of the row of the upper page and the columns, and into fourth to sixth groups in combinations of the rows of the central and lower pages and the columns;
allocating a first bit value to an initial sequence constituted by a combination of the rows and a first column of the columns, allocating the first bit value to the elements of the first group and the elements of the third group, and allocating a second bit value to the elements of the second group;
allocating the second bit value to at least one element, among elements in the fourth group, in the row of at least one of the central page and the lower page, the at least one element to which the second bit value is allocated being positioned in a left diagonal direction from a first element of the second group;
allocating the first or second bit value to elements of the fourth group to which no bits values are yet allocated based on the bit values allocated to the initial sequence and the at least one element, such that the initial sequence and at least one other sequence constituted by one or more combinations of the rows and one or more initial columns following the first column constitute a gray code;
allocating the first or second bit value to elements of the fifth group based on the bit values allocated to the at least one other sequence and the elements of the second group, such that a plurality of sequences constituted by combinations of the rows and central columns following the one or more initial columns constitute a gray code with the at least one other sequence; and
allocating the first or second bit value to the elements of the sixth group based on the bit values allocated to the plurality of sequences and the elements of the third group, such that further sequences constituted by combinations of the rows and columns following the central columns constitute a gray code with the plurality of sequences.

2. The method of claim 1, wherein the memory cells comprise triple level cells (TLCs).

3. The method of claim 1, wherein the memory cells comprise quad level cells (QLCs).

4. The method of claim 1, wherein the first bit value comprises a logical level "0".

5. The method of claim 4, wherein the second bit value comprises a logical level "1".

6. The method of claim 1, wherein the dividing of the elements of the matrix comprises:
dividing elements of the matrix into the first group, the second group, and the third group based on predetermined read points for the row of the upper page; and
dividing the elements of the matrix into the fourth group, the fifth group, and the sixth group, such that the elements of the fourth, fifth, and sixth groups correspond to the elements of the first, second, and third groups, respectively.

7. A memory device comprising:
a memory cell array comprising a plurality of memory cells; and
a control circuit suitable for programming the memory cell array,
wherein the control circuit programs the memory cell array by performing operations of:
constituting a matrix which has rows for at least an upper page, a central page, and a lower page and columns for a plurality of voltage levels;
dividing elements of the matrix into first to third groups in combinations of the row of the upper page and the columns, and into fourth to sixth groups in combinations of the rows of the central and lower pages and the columns;
allocating a first bit value to an initial sequence constituted by a combination of the rows and a first column of the columns, allocating the first bit value to the elements of the first group and the elements of the third group, and allocating a second bit value to the elements of the second group;
allocating the second bit value to at least one element, among elements in the fourth group, in the row of at least one of the central page and the lower page, the at least one element to which the second bit value is allocated being positioned in a left diagonal direction from a first element of the second group;

allocating the first or second bit value to elements of the fourth group to which no bits values are yet allocated based the bit values allocated to the initial sequence and the at least one element, such that the initial sequence and at least one other sequence constituted by one or more combinations of the rows and one or more initial columns following the first column constitute a gray code;

allocating the first or second bit value to the elements of the fifth group based on the bit values allocated to the at least one other sequence and the elements of the second group, such that a plurality of sequences constituted by combinations of the rows and central columns following the one or more initial columns constitute a gray code with the at least one other sequence; and allocating the first or second bit value to the elements of the sixth group based on the bit values allocated to the plurality of sequences and the elements of the third group, such that further sequences constituted by combinations of the rows and the other columns following the central columns constitute a gray code with the plurality of sequences.

8. The memory device of claim 7, wherein the memory cells comprise TLCs.

9. The memory device of claim 7, wherein the memory cells comprise QLCs.

10. The memory device of claim 7, wherein the first bit value comprises a logical level "0".

11. The memory device of claim 10, wherein the second bit value comprises a logical level "1".

12. The memory device of claim 7, wherein the control circuit divides the elements of the matrix into the first group, the second group, and the third group based on predetermined read points for the row of the upper page, and divides the elements of the matrix into the fourth group, the fifth group, and the sixth group, such that the elements of the fourth, fifth and sixth groups correspond to the elements of the first, second, and third groups, respectively.

13. A method for programming a memory device including a plurality of memory cells, comprising:
constituting a matrix including a plurality of components, the matrix being defined by rows of at least an upper page, a central page, and a lower page and columns of a plurality of voltage levels;
dividing the plurality of components into plurality of groups;
assigning a first bit value to an initial sequence and a first sub group of the plurality of groups and a second bit value to a second sub group of the plurality of groups, wherein either the first and second sub groups are discontinuous or the first and second sub groups are arranged alternatively; and
assigning one of the first bit value and the second bit value to a third sub group in which neither the first bit value nor the second bit value is yet assigned, so that all sequential bit values assigned to the plurality of groups constitute a gray code.

* * * * *